(12) United States Patent
Kim et al.

(10) Patent No.: US 12,453,078 B2
(45) Date of Patent: Oct. 21, 2025

(54) SEMICONDUCTOR MEMORY DEVICE

(71) Applicant: Samsung Electronics Co., Ltd., Suwon-si (KR)

(72) Inventors: Teawon Kim, Suwon-si (KR); Yurim Kim, Suwon-si (KR); Seunghee Lee, Suwon-si (KR); Seungwoo Jang, Suwon-si (KR); Yong-Suk Tak, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 416 days.

(21) Appl. No.: 18/175,198

(22) Filed: Feb. 27, 2023

(65) Prior Publication Data

US 2023/0354605 A1 Nov. 2, 2023

(30) Foreign Application Priority Data

Apr. 27, 2022 (KR) .................. 10-2022-0052115

(51) Int. Cl.
*H10B 12/00* (2023.01)
*H10B 41/27* (2023.01)
*H10B 43/27* (2023.01)
*H10B 41/10* (2023.01)
*H10B 41/40* (2023.01)
(Continued)

(52) U.S. Cl.
CPC .......... *H10B 12/315* (2023.02); *H10B 12/34* (2023.02); *H10B 41/27* (2023.02); *H10B 43/27* (2023.02); *H10B 41/10* (2023.02); *H10B 41/40* (2023.02); *H10B 43/10* (2023.02); *H10B 43/40* (2023.02)

(58) Field of Classification Search
CPC .... H10B 12/315; H10B 12/34; H10B 12/482; H10B 12/485; H10B 12/488; H10B 41/10; H10B 41/27; H10B 41/40; H10B 43/10; H10B 43/27; H10B 43/40; H10D 62/235; H10D 62/292; H10D 64/511; H10D 64/512; H10D 64/517; H10D 64/518

See application file for complete search history.

(56) References Cited

U.S. PATENT DOCUMENTS 10,256,252 B1 * 4/2019 Kanazawa .......... H01L 21/0217
10,304,684 B2 5/2019 Jang et al.
10,790,396 B2 9/2020 Sawabe et al.
(Continued)

FOREIGN PATENT DOCUMENTS

KR 10-2020-0076343 A 6/2020
KR 10-2021-0004658 A 1/2021
(Continued)

*Primary Examiner* — Scott B Geyer
(74) *Attorney, Agent, or Firm* — Fish & Richardson P.C.

(57) ABSTRACT

A semiconductor memory device includes a bit line, a channel pattern including a horizontal channel portion on the bit line and a vertical channel portion vertically protruding from the horizontal channel portion, a word line on the horizontal channel portion and on a sidewall of the vertical channel portion, and a gate insulating pattern between the word line and the channel pattern. The channel pattern includes an oxide semiconductor and includes first, second, and third channel layers sequentially stacked. The first to third channel layers include a first metal, and the second channel layer further includes a second metal different from the first metal. At least a portion of the first channel layer contacts the bit line.

20 Claims, 13 Drawing Sheets

(51) Int. Cl.
  *H10B 43/10*  (2023.01)
  *H10B 43/40*  (2023.01)

(56) References Cited

U.S. PATENT DOCUMENTS

| | | | |
|---|---|---|---|
| 10,923,493 B2* | 2/2021 | Fayrushin | H01L 23/528 |
| 11,696,434 B2* | 7/2023 | Lee | H10B 12/395 |
| | | | 257/296 |
| 2008/0093664 A1* | 4/2008 | Yun | H10D 64/693 |
| | | | 257/E27.098 |
| 2015/0325663 A1* | 11/2015 | Wang | H10B 41/30 |
| | | | 438/266 |
| 2018/0076210 A1* | 3/2018 | Hamada | H10B 41/35 |
| 2018/0083028 A1* | 3/2018 | Fukumoto | H10D 62/40 |
| 2018/0108669 A1* | 4/2018 | Zhu | H10B 43/27 |
| 2018/0323200 A1* | 11/2018 | Tang | H10B 12/48 |
| 2019/0280005 A1* | 9/2019 | Bin | H10B 43/27 |
| 2019/0319041 A1* | 10/2019 | Kwak | H01L 21/76877 |
| 2020/0119030 A1* | 4/2020 | Dasgupta | H10B 41/27 |
| 2021/0143284 A1 | 5/2021 | Karda et al. | |
| 2021/0336059 A1 | 10/2021 | Lai et al. | |
| 2021/0384357 A1 | 12/2021 | Park et al. | |
| 2021/0399052 A1 | 12/2021 | Wu et al. | |
| 2022/0052200 A1 | 2/2022 | Dewey et al. | |
| 2022/0367721 A1* | 11/2022 | Jeong | H10B 12/05 |
| 2022/0384525 A1 | 12/2022 | Wu et al. | |
| 2023/0122757 A1 | 4/2023 | Wang et al. | |

FOREIGN PATENT DOCUMENTS

| | | | | |
|---|---|---|---|---|
| KR | 20220155508 A | * | 11/2022 | H01L 21/0228 |
| TW | 202119592 A | | 5/2021 | |
| TW | 202131514 A | | 8/2021 | |
| TW | 202145454 A | | 12/2021 | |
| TW | 202201742 A | | 1/2022 | |

* cited by examiner

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2022-0052115, filed on Apr. 27, 2022, in the Korean Intellectual Property Office, the entire contents of which are hereby incorporated by reference.

BACKGROUND

Various example embodiments relate to a semiconductor memory device, and more particularly, to a semiconductor memory device including vertical channel transistors and/or a method of manufacturing the same.

As design rules of semiconductor devices have been reduced, manufacturing techniques have been developed to improve integration densities, operating speeds and/or yields of semiconductor devices. Thus, a transistor having a vertical channel has been suggested to increase an integration density, a resistance and/or a current driving ability of the transistor.

SUMMARY

Various example embodiments may provide a semiconductor memory device capable of improving electrical characteristics and/or an integration density.

According to some example embodiments, a semiconductor memory device may include a bit line; a channel pattern including a horizontal channel portion on the bit line; a vertical channel portion vertically protruding from the horizontal channel portion; a word line on the horizontal channel portion and on a sidewall of the vertical channel portion; and a gate insulating pattern between the word line and the channel pattern. The channel pattern may include an oxide semiconductor and may include first, second and third channel layers stacked sequentially. The first to third channel layers may include a first metal, and the second channel layer may include a second metal different from the first metal. At least a portion of the first channel layer may be in contact with the bit line.

According to some example embodiments, a semiconductor memory device may include a bit line; a channel pattern including a horizontal channel portion on the bit line, and first and second vertical channel portions vertically protruding from the horizontal channel portion and facing each other; first and second word lines on the horizontal channel portion and between the first and second vertical channel portions; a gate insulating pattern between the channel pattern and the first and second word lines; and an insulating pattern provided between the first and second word lines. The channel pattern may include an oxide semiconductor and may include first, second, and third channel layers stacked sequentially. The first to third channel layers may include a first metal, and the second channel layer may further include a second metal different from the first metal. At least a portion of the first channel layer may be in contact with the bit line.

According to some example embodiments, a semiconductor memory device may include a peripheral circuit structure comprising peripheral circuits on a semiconductor substrate and a lower insulating layer covering the peripheral circuits; bit lines extending in a first direction on the peripheral circuit structure; a first insulating pattern defining a trench that extends in a second direction to intersect the bit lines; channel patterns spaced apart from each other in the second direction in the trench, wherein each of the channel patterns includes first and second vertical channel portions facing each other and a horizontal channel portion connecting the first and second vertical channel portions; first and second word lines extending in the second direction on the horizontal channel portions of the channel patterns, the first word line adjacent to the first vertical channel portions of the channel patterns, and the second word line adjacent to the second vertical channel portions of the channel patterns; a gate insulating pattern between the channel patterns and the first and second word lines and extending in the second direction; a second insulating pattern covering the first and second word lines in the trench; first data storage patterns on the first vertical channel portions of the channel patterns; and second data storage patterns disposed on the second vertical channel portions of the channel patterns. Each of the channel patterns may include an oxide semiconductor and may include first, second, and third channel layers stacked sequentially. The first to third channel layers may include a first metal, and the second channel layer may further include a second metal different from the first metal. At least a portion of the first channel layer may contact the bit line.

DETAILED DESCRIPTION

Embodiments of inventive concepts will now be described more fully with reference to the accompanying drawings.

Figure 1:
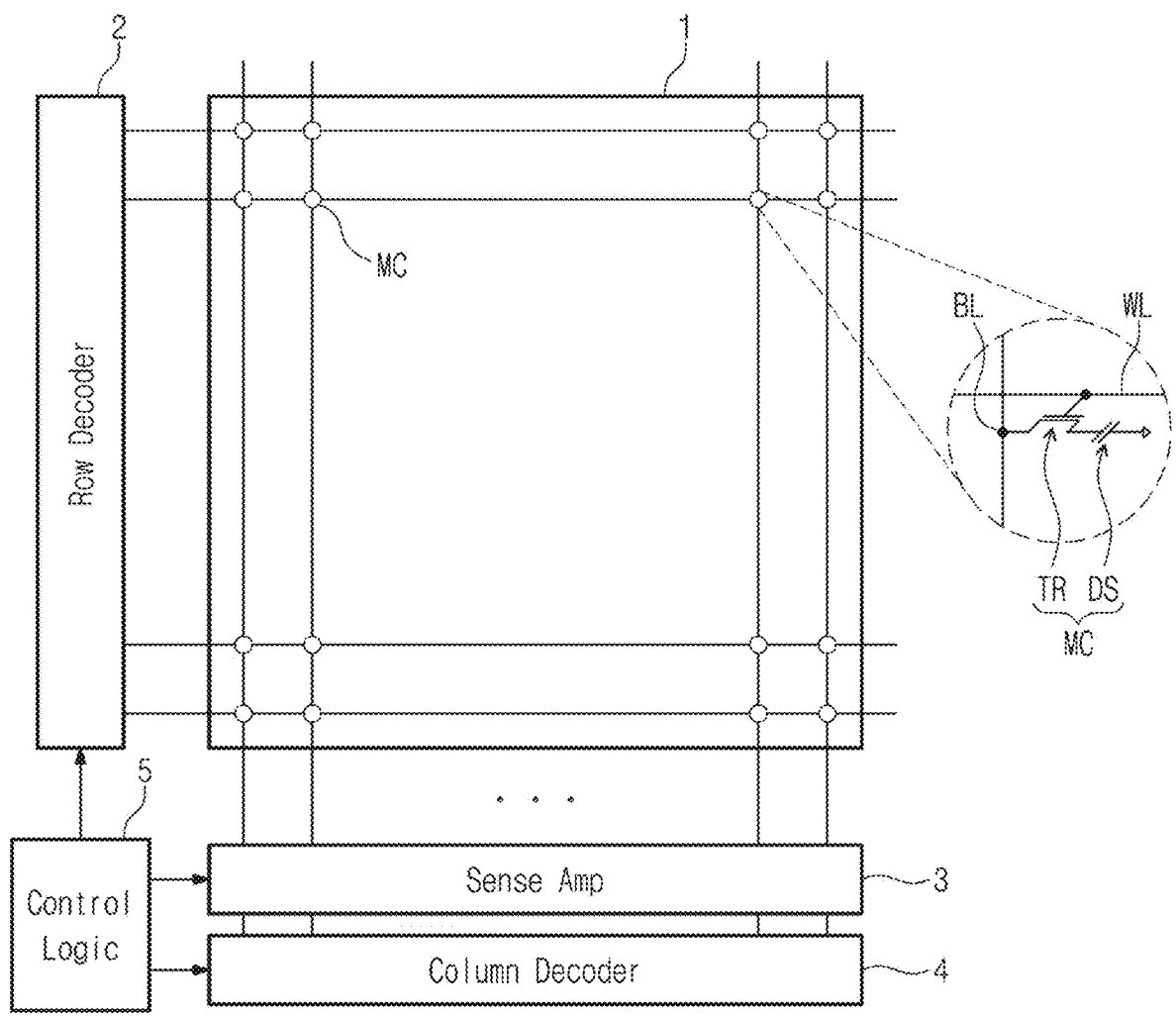
FIG. 1 is a block diagram illustrating a semiconductor memory device according to some example embodiments of inventive concepts.

FIG. 1 is a block diagram illustrating a semiconductor memory device according to some example embodiments of inventive concepts.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC arranged two-dimensionally or three-dimensionally. Each of the memory cells MC may be connected between a word line WL and a bit line BL which intersect each other.

Each of the memory cells MC may include a selection element TR and a data storage element DS, and the selection element TR and the data storage element DS may be electrically connected in series to each other. The selection element TR may be connected between the data storage element DS and the word line WL, and the data storage element DS may be connected to the bit line BL through the selection element TR. The selection element TR may be or may include a field effect transistor (FET), and the data storage element DS may be realized as one or more of a capacitor, a magnetic tunnel junction pattern, a memristor, or a variable resistor. For example, the selection element TR may include a transistor, a gate electrode of the transistor may be connected to the word line WL, and drain/source terminals of the transistor may be connected to the bit line BL and the data storage element DS, respectively. At least some of the memory cells MC may be redundant memory cells; however, example embodiments are not limited thereto. A number of bit lines BL may be the same as, or different from (e.g. less than or greater than) a number of word lines WL.

The row decoder 2 may decode an address signal that is input from the outside to select one among the word lines WL of the memory cell array 1. The address signal decoded in the row decoder 2 may be provided to a row driver (not shown), and the row driver may respectively provide specific, e.g., dynamically determined (or, alternatively, predetermined) voltages to the selected word line WL and unselected word lines WL in response to control signals of control circuits.

The sense amplifier 3 may sense and amplify a voltage difference between the bit line BL selected by an address signal decoded from the column decoder 4 and a reference bit line, such as a complimentary bit line, and may output the amplified voltage difference.

The column decoder 4 may provide a data transmission path between the sense amplifier 3 and an external device (e.g., a memory controller). The column decoder 4 may decode an address signal inputted from the outside to select one among the bit lines BL.

The control logic 5 may generate control signals for controlling operations of writing/reading data into/from the memory cell array 1.

Figure 2:
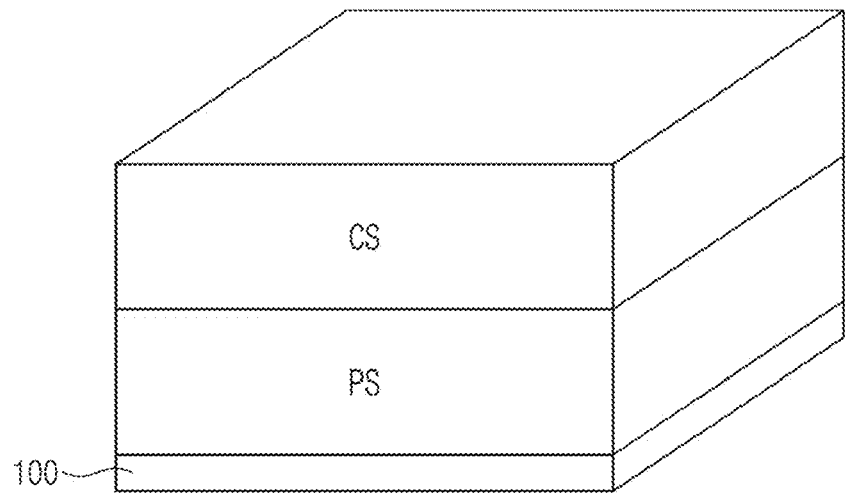
FIGS. 2 and 3 are perspective views schematically illustrating semiconductor memory devices according to some example embodiments of inventive concepts.
Figure 3:
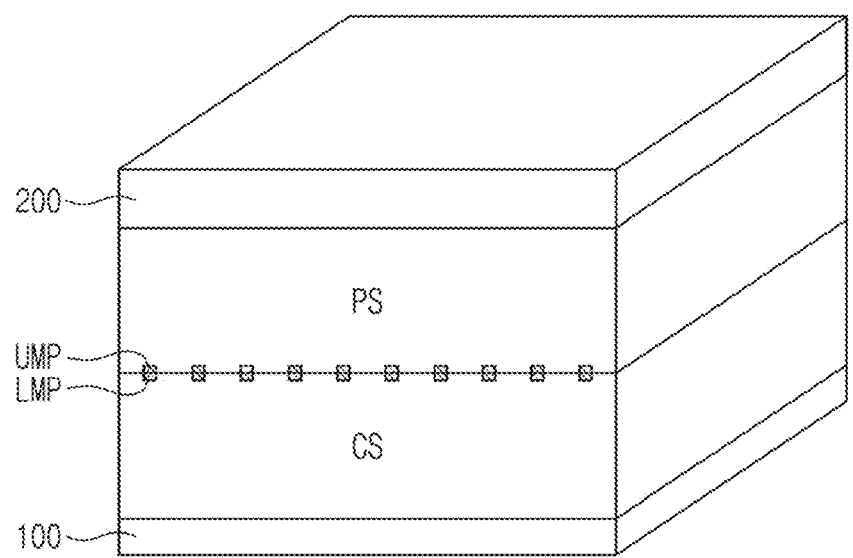

FIGS. 2 and 3 are perspective views schematically illustrating semiconductor memory devices according to some example embodiments of inventive concepts.

Referring to FIG. 2, a semiconductor memory device may include a peripheral circuit structure PS on a semiconductor substrate 100, and a cell array structure CS on the peripheral circuit structure PS.

The peripheral circuit structure PS may include core and peripheral circuits formed on the semiconductor substrate 100. The core and peripheral circuits may include the row and column decoders 2 and 4, the sense amplifier 3 and the control logic 5, described with reference to FIG. 1.

Referring to FIG. 3, a cell array structure CS may include a memory cell array (see 1 of FIG. 1) including memory cells (see MC of FIG. 1) two-dimensionally or three-dimensionally arranged on a first semiconductor substrate 100. As described above, the memory cell array (see 1 of FIG. 1) may include the word lines WL, the bit lines BL, and the memory cells MC connected therebetween.

A peripheral circuit structure PS may include core and peripheral circuits formed on a second semiconductor substrate 200. The core and peripheral circuits may include the row and column decoders 2 and 4, the sense amplifier 3 and the control logic 5, described with reference to FIG. 1.

Lower metal pads LMP may be provided in an uppermost layer of the cell array structure CS. The lower metal pads LMP may be electrically connected to the memory cell array (see 1 of FIG. 1). Upper metal pads UMP may be provided in an uppermost layer of the peripheral circuit structure PS. The upper metal pads UMP may be electrically connected to the core and peripheral circuits (see 2, 3, 4 and 5 of FIG. 1).

The lower and upper metal pads LMP and UMP may have substantially the same size and/or substantially the same arrangement. For example, the lower and upper metal pads LMP and UMP may include copper (Cu), aluminum (Al), nickel (Ni), cobalt (Co), tungsten (W), titanium (Ti), tin (Sn), or any alloy thereof. For example, the lower metal pads LMP may not include metal that is not included in the upper metal pads UMP, and/or the upper metal pads UMP may not include a metal that is not included in the lower metal pads LMP.

According to some example embodiments of inventive concepts, the cell array structure CS including the memory cells may be formed on the first semiconductor substrate 100, the peripheral circuit structure PS including the core and peripheral circuits may be formed on the second semiconductor substrate 200 different from the first semiconductor substrate 100, and then, the cell array structure CS and the peripheral circuit structure PS may be connected to each other by a bonding method to manufacture the semiconductor memory device. For example, the lower metal pads LMP of the cell array structure CS may be electrically and physically connected to the upper metal pads UMP of the peripheral circuit structure PS by the bonding method. For example, the lower metal pads LMP may be in direct contact with the upper metal pads UMP.

Figure 4:
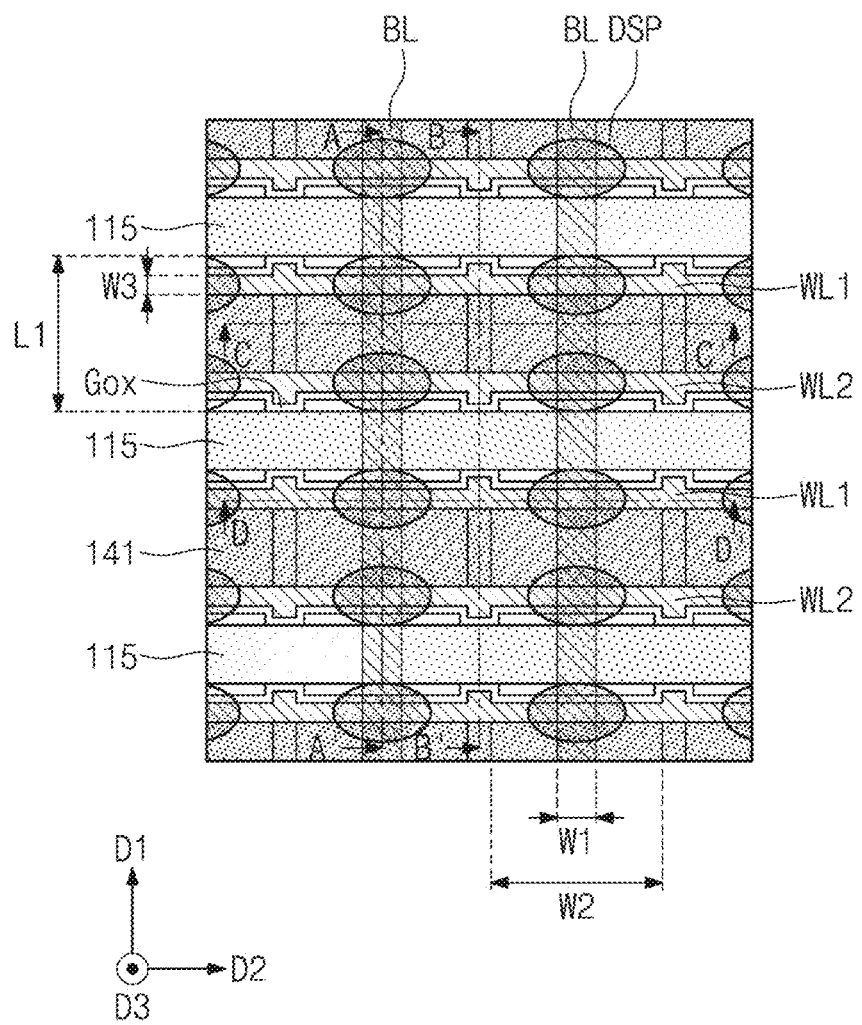
FIG. 4 is a plan view illustrating a semiconductor memory device according to some example embodiments of inventive concepts.
Figure 5A:
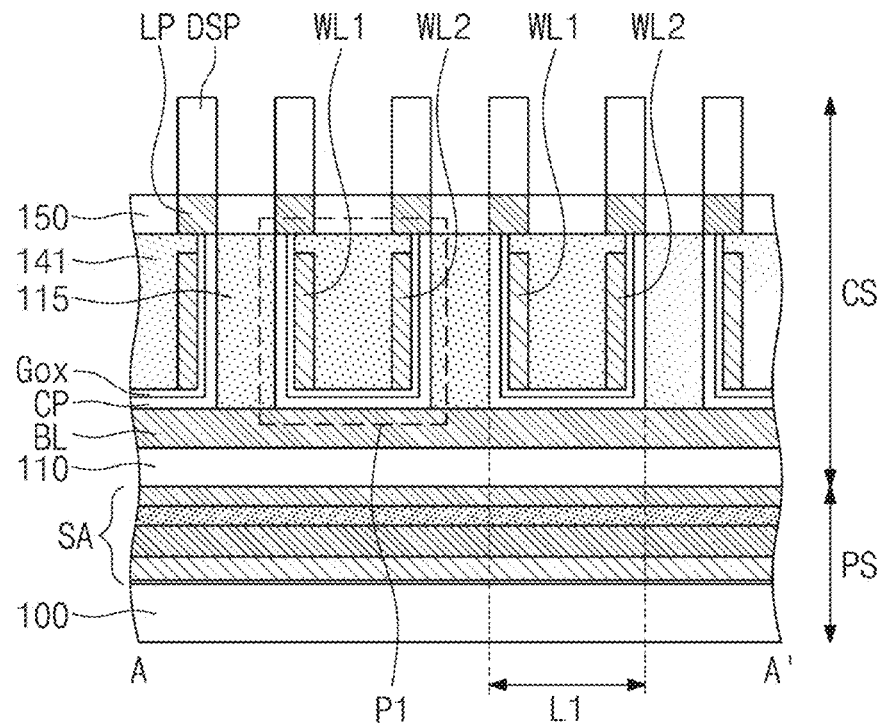
FIGS. 5A to 5D are cross-sectional views taken along lines A-A', B-B', C-C' and D-D' of FIG. 4, respectively, to illustrate a semiconductor memory device according to some example embodiments of inventive concepts.
Figure 5B:
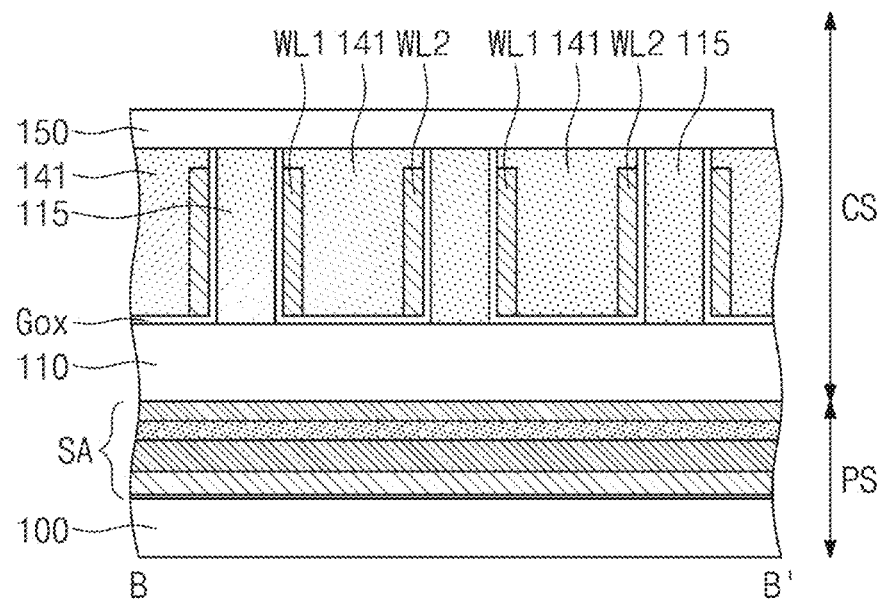
Figure 5C:
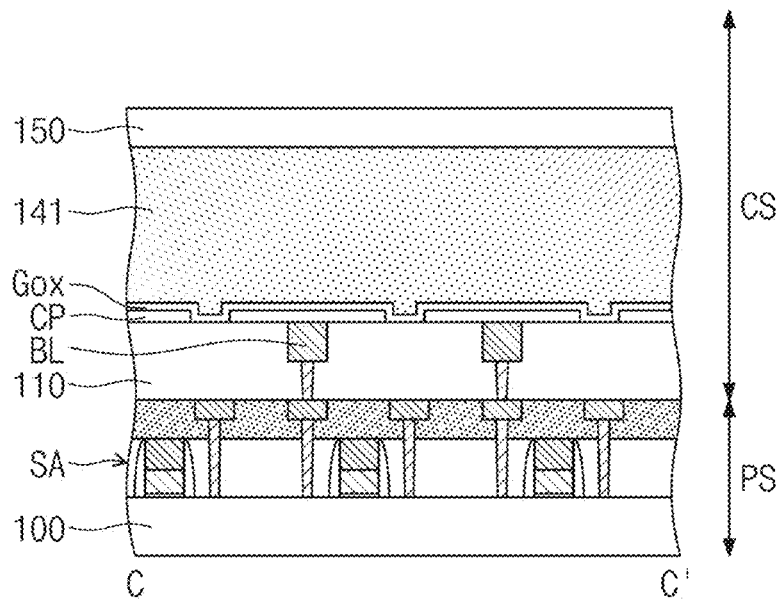
Figure 5D:
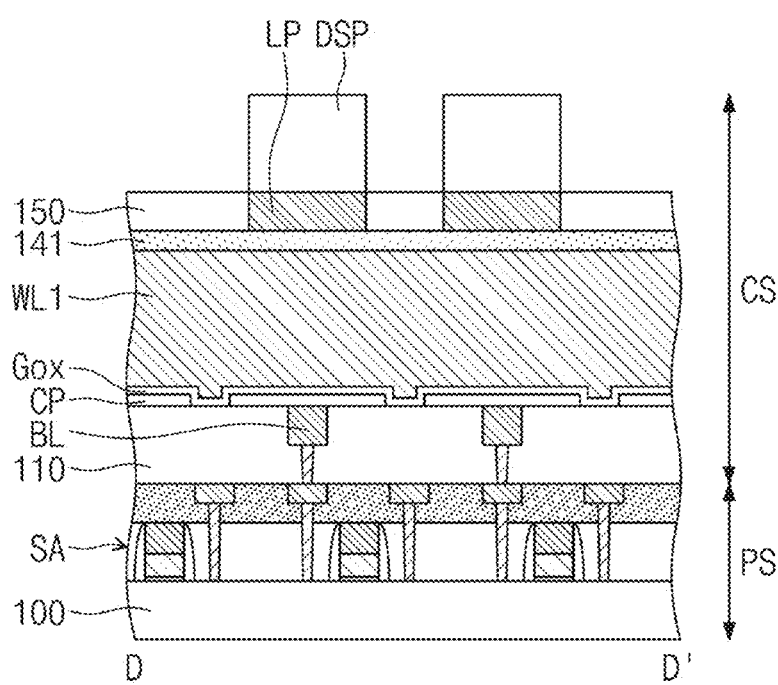

FIG. 4 is a plan view illustrating a semiconductor memory device according to some example embodiments of inventive concepts. FIGS. 5A to 5D are cross-sectional views taken along lines A-A', B-B', C-C' and D-D' of FIG. 4, respectively, to illustrate a semiconductor memory device according to some example embodiments of inventive concepts. FIGS. 6A to 6E are enlarged views of a portion 'P1' of FIG. 5A.

Referring to FIGS. 4 and 5A to 5D, a semiconductor memory device according to some example embodiments of inventive concepts may include a peripheral circuit structure PS and a cell array structure CS on the peripheral circuit structure PS.

A semiconductor substrate 100 may be or may include a single-crystalline silicon substrate, and may be undoped or may be doped, e.g., lightly doped with an impurity such as boron and/or phosphorus. Core and peripheral circuits SA may include the row and column decoders 2 and 4, the sense amplifier 3 and the control logic 5, described with reference to FIG. 1. For example, the core and peripheral circuits SA may include NMOS and PMOS transistors integrated on or in the semiconductor substrate 100. The core and peripheral circuits SA may be electrically connected to bit lines BL through peripheral circuit interconnection lines and peripheral circuit contact plugs. For example, the sense amplifiers may be electrically connected to the bit lines BL, and each of the sense amplifiers may amplify and output a difference between voltage levels sensed from a pair of the bit lines BL. The NMOS and PMOS transistors may be planar transistors;

however, example embodiments are not limited thereto, and the NMOS and/or PMOS transistors may be three-dimensional transistors.

A lower insulating layer 110 may cover the core and peripheral circuits SA, the peripheral circuit interconnection lines and the peripheral circuit contact plugs on the semiconductor substrate 100. The lower insulating layer 110 may include a plurality of stacked insulating layers. For example, the lower insulating layer 110 may include one or more of a silicon oxide layer, a silicon nitride layer, a silicon oxynitride layer, and/or a low-k dielectric layer.

The cell array structure CS may include memory cells including vertical channel transistors (VCTs). The vertical channel transistor may have a structure in which a channel length extends in a direction perpendicular to a top surface of the semiconductor substrate 100. The cell array structure CS may include a plurality of the bit lines BL, channel patterns CP, first and second word lines WL1 and WL2, a gate insulating pattern Gox, and data storage patterns DSP.

The bit lines BL may extend in a first direction D1 on the lower insulating layer 110 and may be spaced apart from each other in a second direction D2. A space between the bit lines BL may be filled with an insulating material such as but not limited to silicon nitride and/or silicon oxide. Each of the bit lines BL may have a first width W1 in the second direction D2, and the first width W1 may range from about 1 nm to about 50 nm.

For example, the bit lines BL may include doped poly-silicon, a metal, a conductive metal nitride, a conductive metal silicide, a conductive metal oxide, or any combination thereof. The bit lines BL may be formed of or may include, but not limited to, doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. The bit lines BL may include a single layer or multi-layer of the aforementioned materials. In some example embodiments, the bit lines BL may include a two-dimensional semiconductor material, and for example, the two-dimensional semiconductor material may include graphene, carbon nanotube, or a combination thereof, at a thickness of a single monolayer or more than a single monolayer.

In some example embodiments, a first insulating pattern 115 may be disposed on the bit lines BL, and the first insulating pattern 115 may have or define trenches T which intersect the bit lines BL to extend in the second direction D2 and are spaced apart from each other in the first direction D1.

The channel patterns CP may be spaced apart from each other in the second direction D2 in each of the trenches T. For example, the first insulating pattern 115 may be disposed between the channel patterns CP adjacent to each other in the first direction D1. A top surface of the first insulating pattern 115 may be located at substantially the same level as top surfaces of first and second vertical channel portions VCP1 and VCP2 of the channel patterns CP. For example, the first insulating pattern 115 may include a silicon oxide layer, a silicon nitride layer, a silicon oxynitride layer, and/or a low-k dielectric layer.

The channel patterns CP may be disposed on the bit lines BL. The channel patterns CP may be spaced apart from each other in the first direction D1 on each of the bit lines BL. For example, the channel patterns CP may be two-dimensionally arranged in the first direction D1 and the second direction D2 which intersect each other.

Each of the channel patterns CP may have a first length L1 in the first direction D1 and may have a second width W2 in the second direction D2, which is substantially greater than or equal to first width W1 of the bit line BL. A distance between the channel patterns CP adjacent to each other in the first direction D1 may be different from the first length L1 of the channel pattern CP in the first direction D1. For example, the distance between the channel patterns CP adjacent to each other in the first direction D1 may be less than the first length L1 of the channel pattern CP in the first direction D1. Alternatively, the distance between the channel patterns CP adjacent to each other in the first direction D1 may be substantially equal to the first length L1 of the channel pattern CP in the first direction D1. A distance between the channel patterns CP adjacent to each other in the second direction D2 may be substantially equal to or less than the second width W2 of the channel pattern CP.

Referring to FIGS. 6A to 6E, each of the channel patterns CP may include a horizontal channel portion HCP disposed on the bit line BL, and first and second vertical channel portions VCP1 and VCP2 vertically protruding from the horizontal channel portion HCP and facing each other in the first direction D1. Each of the first and second vertical channel portions VCP1 and VCP2 may have an inner sidewall and an outer sidewall which are opposite to each other, and the inner sidewalls of the first and second vertical channel portions VCP1 and VCP2 may face each other in the first direction D1. In addition, the outer sidewalls of the first and second vertical channel portions VCP1 and VCP2 of the channel patterns CP adjacent to each other may face each other. The outer sidewalls of the first and second vertical channel portions VCP1 and VCP2 of the channel patterns CP may be in contact with sidewalls of the first insulating pattern 115.

Each of the first and second vertical channel portions VCP1 and VCP2 may have a vertical length in the direction perpendicular to the top surface of the semiconductor substrate 100 and may have a width in the first direction D1. The vertical length of each of the first and second vertical channel portions VCP1 and VCP2 may range from about 2 times to about 10 times the width thereof, but example embodiments of inventive concepts are not limited thereto. The width, in the first direction D1, of each of the first and second vertical channel portions VCP1 and VCP2 may range from several nanometers (nm) to several tens nanometers (nm). For example, the width of each of the first and second vertical channel portions VCP1 and VCP2 may range from 1 nm to 30 nm (more particularly, from 1 nm to 10 nm).

The horizontal channel portions HCP of the channel patterns CP may be in contact with or in direct contact with top surfaces of the bit lines BL. A thickness of the horizontal channel portion HCP on the top surface of the bit line BL may be substantially equal to thicknesses of the first and second vertical channel portions VCP1 and VCP2 on the sidewalls of the first insulating pattern 115.

In each of the channel patterns CP, the horizontal channel portion HCP may include a common source/drain region, a top end portion of the first vertical channel portion VCP1 may include a first source/drain region, and a top end portion of the second vertical channel portion VCP2 may include a second source/drain region. The first vertical channel portion VCP1 may include a first channel region between the first source/drain region and the common source/drain region, and the second vertical channel portion VCP2 may include a second channel region between the second source/drain region and the common source/drain region. In some example embodiments, the first channel region of the first vertical channel portion VCP1 may be controlled by the first word line WL1, and the second channel region of the second vertical channel portion VCP2 may be controlled by the second word line WL2.

The channel patterns CP may include an oxide semiconductor, and for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or any combination thereof. For example, the channel patterns CP may include indium gallium zinc oxide (IGZO). The channel patterns CP may include a single layer or multi-layer of the oxide semiconductor. The channel patterns CP may include one or more of an amorphous, single-crystalline or poly-crystalline oxide semiconductor. In some example embodiments, the channel patterns CP may have a band gap energy greater than a band gap energy of silicon. For example, the channel patterns CP may have a band gap energy of about 1.5 eV to about 5.6 eV. For example, the channel patterns CP may have optimal channel performance when they have a band gap energy of about 2.0 eV to about 4.0 eV. For example, the channel patterns CP may be poly-crystalline or amorphous, but embodiments of inventive concepts are not limited thereto. In certain embodiments, the channel patterns CP may include a two-dimensional semiconductor material, and for example, the two-dimensional semiconductor material may include graphene, carbon nanotube, or a combination thereof, at a thickness of a single monolayer, or a plurality of monolayers.

The first and second word lines WL1 and WL2 may intersect the bit lines BL to extend in the second direction D2 and may be alternately arranged in the first direction D1. A pair of the first and second word lines WL1 and WL2 may be disposed on the horizontal channel portion HCP between the first and second vertical channel portions VCP1 and VCP2 of each of the channel patterns CP.

Each of the first and second word lines WL1 and WL2 may have an inner sidewall and an outer sidewall opposite to the inner sidewall, and the inner sidewalls of the first and second word lines WL1 and WL2 may face each other on the horizontal channel portion HCP. The outer sidewall of the first word line WL1 may be adjacent to the inner sidewall of the first vertical channel portion VCP1, and the outer sidewall of the second word line WL2 may be adjacent to the inner sidewall of the second vertical channel portion VCP2. The first word line WL1 may be adjacent to the first channel region of the first vertical channel portion VCP1, and the second word line WL2 may be adjacent to the second channel region of the second vertical channel portion VCP2. Top surfaces of the first and second word lines WL1 and WL2 may be located at a lower level than the top surfaces of the first and second vertical channel portions VCP1 and VCP2 of the channel patterns CP.

Each of the first and second word lines WL1 and WL2 may have a third width W3 in the first direction D1, which is less than the first width W1 of the bit line BL. The third width W3 of each of the first and second word lines WL1 and WL2 may range from about 1 nm to about 50 nm.

For example, the first and second word lines WL1 and WL2 may include doped poly-silicon, a metal, a conductive metal nitride, a conductive metal silicide, a conductive metal oxide, or any combination thereof. The first and second word lines WL1 and WL2 may be formed of or include, but not limited to, doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof. The first and second word lines WL1 and WL2 may include a single layer or multi-layer of the aforementioned materials of a single monolayer of thickness or of a plurality of monolayers of thickness. In certain example embodiments, the first and second word lines WL1 and WL2 may include a two-dimensional semiconductor material, and for example, the two-dimensional semiconductor material may include graphene, carbon nanotube, or a combination thereof.

The gate insulating pattern Gox may be disposed between the channel patterns CP and the first and second word lines WL1 and WL2. The gate insulating pattern Gox may cover surfaces of the channel patterns CP with a substantially uniform thickness. The gate insulating pattern Gox may be in direct contact with a top surface of the lower insulating layer 110 and the sidewalls of the first insulating pattern 115 between the channel patterns CP.

The gate insulating pattern Gox may be disposed between the horizontal channel portion HCP of the channel pattern CP and bottom surfaces of the first and second word lines WL1 and WL2, between the outer sidewall of the first word line WL1 and the inner sidewall of the first vertical channel portion VCP1, and between the outer sidewall of the second word line WL2 and the inner sidewall of the second vertical channel portion VCP2.

The gate insulating pattern Gox may be formed of a silicon oxide layer, a silicon oxynitride layer, a high-k dielectric layer having a dielectric constant higher than that of a silicon oxide layer, or any combination thereof. The high-k dielectric layer may be formed of a metal oxide or a metal oxynitride. For example, the high-k dielectric layer usable as the gate insulating pattern Gox may be formed of, but not limited to, $HfO_2$, HfSiO, HfSiON, HfTaO, HfSiO, HfZrO, $ZrO_2$, $Al_2O_3$, or any combination thereof.

Referring to FIGS. 6A to 6E, landing pads LP may be disposed on the first and second vertical channel portions VCP1 and VCP2 of the channel pattern CP. The landing pads LP may be in direct contact with the first and second vertical channel portions VCP1 and VCP2. In other words, the landing pads LP may be in direct contact with first to third channel layers CL1, CL2 and CL3. Each of the landing pads LP may have at least one of various shapes such as a circular shape, an elliptical shape, a rectangular shape, a square shape, a diamond shape, and a hexagonal shape when viewed in a plan view.

The landing pads LP may be formed of, but not limited to, doped poly-silicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or any combination thereof.

An interlayer insulating layer 150 may fill a space between the landing pads LP on the first and second insulating patterns 115 and 141.

The data storage patterns DSP may be disposed on the landing pads LP, respectively. The data storage patterns DSP may be electrically connected to the first and second vertical channel portions VCP1 and VCP2 of the channel patterns CP through the landing pads LP, respectively.

In some example embodiments, each of the data storage patterns DSP may be a capacitor and may include lower and upper electrodes, and a capacitor dielectric layer disposed between the lower and upper electrodes. In this case, the lower electrode may be in contact with the landing pad LP, and the lower electrode may have at least one of various shapes such as a circular shape, an elliptical shape, a rectangular shape, a square shape, a diamond shape, and a hexagonal shape when viewed in a plan view.

In certain embodiment, each of the data storage patterns DSP may be a variable resistance pattern which is switchable between two resistance states by an electrical pulse applied thereto. For example, the data storage patterns DSP may include at least one of a phase-change material of which a crystal state is changeable depending on the amount of a current applied thereto, a perovskite compound, a transition metal oxide, a magnetic material, a ferromagnetic material, or an antiferromagnetic material.

Figure 6A:
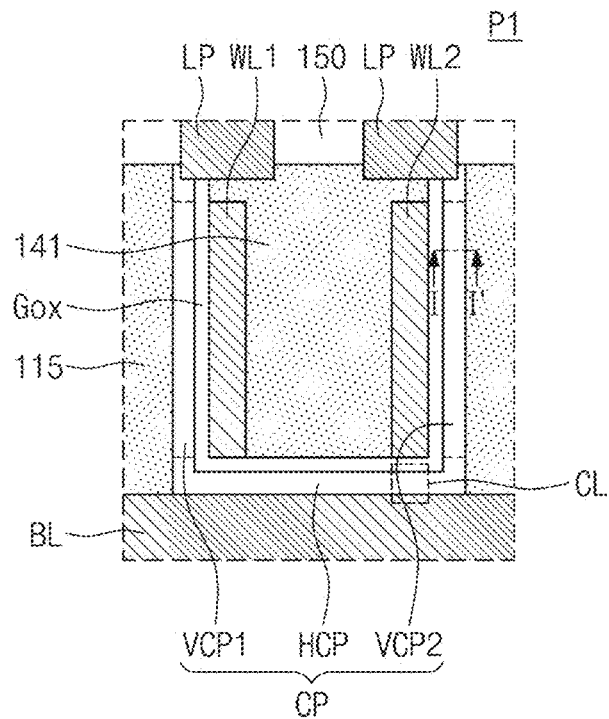
FIGS. 6A to 6E are enlarged views of a portion 'P1' of FIG. 5A.

Referring to FIG. 6A, a portion of the channel pattern CP and a portion of the gate insulating pattern Gox may be located between the first and second word lines WL1 and WL2 when viewed in a plan view. The horizontal channel portion HCP of the channel pattern CP may electrically connect the first and second vertical channel portions VCP1 and VCP2 to a corresponding bit line BL in common. In other words, the semiconductor memory device may have a structure in which a pair of selection transistors shares a single bit line BL.

Figure 6B:
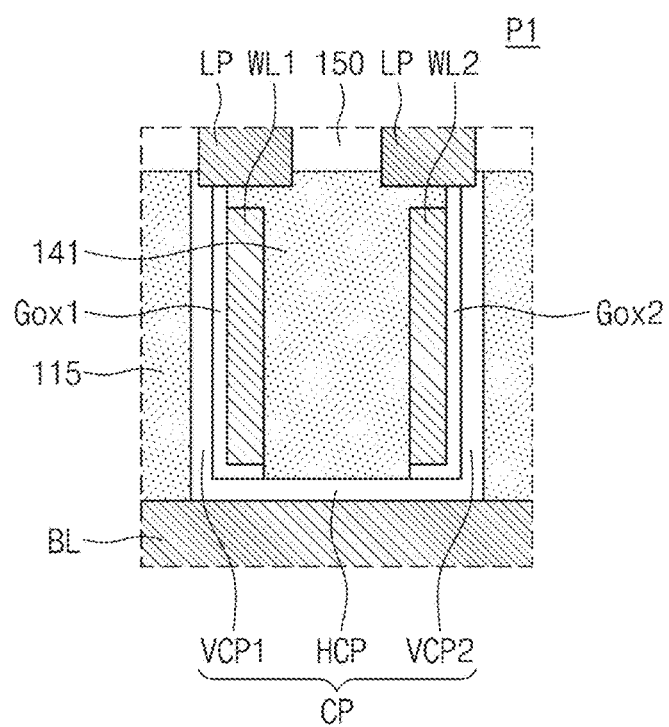

Referring to FIG. 6B, first and second gate insulating patterns Gox1 and Gox2 separated from each other may be disposed on the horizontal channel portion HCP of the channel pattern CP. The first gate insulating pattern Gox1 may be located between the bottom surface of the first word line WL1 and the horizontal channel portion HCP of the channel pattern CP and between the outer sidewall of the first word line WL1 and the first vertical channel portion VCP1 of the channel pattern CP. The second gate insulating pattern Gox2 may be located between the bottom surface of the second word line WL2 and the horizontal channel portion HCP of the channel pattern CP and between the outer sidewall of the second word line WL2 and the second vertical channel portion VCP2 of the channel pattern CP. The first gate insulating pattern Gox1 and the second gate insulating pattern Gox2 may be mirror-symmetrical to each other in the first direction D1.

The horizontal channel portion HCP of the channel pattern CP may be in contact with the second insulating pattern 141 between the first and second word lines WL1 and WL2.

Figure 6C:
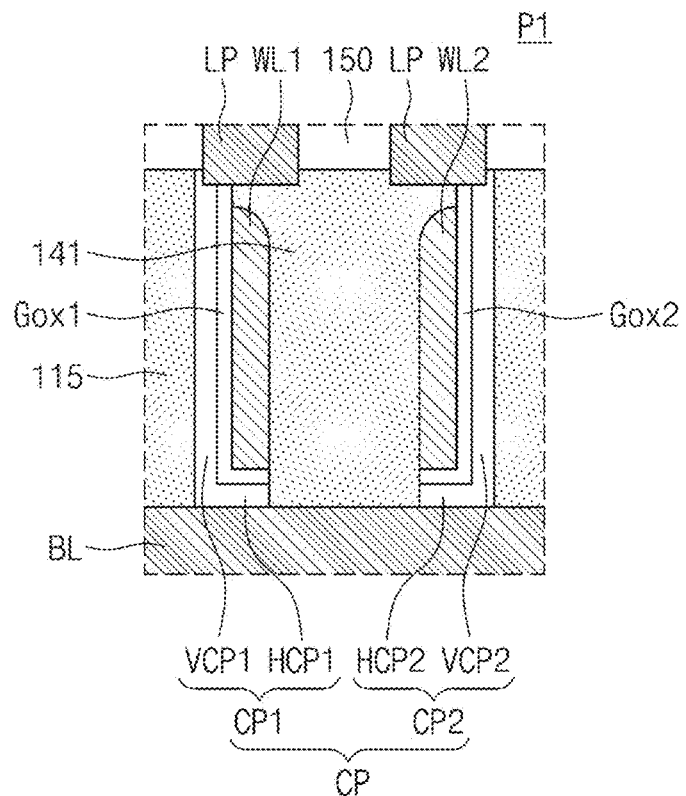

Referring to FIG. 6C, first and second channel patterns CP1 and CP2 may be spaced apart from each other in the first direction D1 on the bit line BL and may be mirror-symmetrical to each other. The first channel pattern CP1 may include a first horizontal channel portion HCP1 being in contact with the bit line BL, and a first vertical channel portion VCP1 vertically protruding from the first horizontal channel portion HCP1 so as to be adjacent to the outer sidewall of the first word line WL1. The second channel pattern CP2 may include a second horizontal channel portion HCP2 being in contact with the bit line BL, and a second vertical channel portion VCP2 vertically protruding from the second horizontal channel portion HCP2 so as to be adjacent to the outer sidewall of the second word line WL2.

A sidewall of the first horizontal channel portion HCP1 of the first channel pattern CP1 and a sidewall of the first gate insulating pattern Gox1 may be aligned with or flush with the inner sidewall of the first word line WL1. Likewise, a sidewall of the second horizontal channel portion HCP2 of the second channel pattern CP2 and a sidewall of the second gate insulating pattern Gox2 may be aligned with or flush with the inner sidewall of the second word line WL2.

The bit line BL may be in contact with the second insulating pattern 141 between the first horizontal channel portion HCP1 of the first channel pattern CP1 and the second horizontal channel portion HCP2 of the second channel pattern CP2.

In addition, the first and second word lines WL1 and WL2 may have spacer shapes. In other words, the first and second word lines WL1 and WL2 may have rounded top surfaces.

Figure 6D:
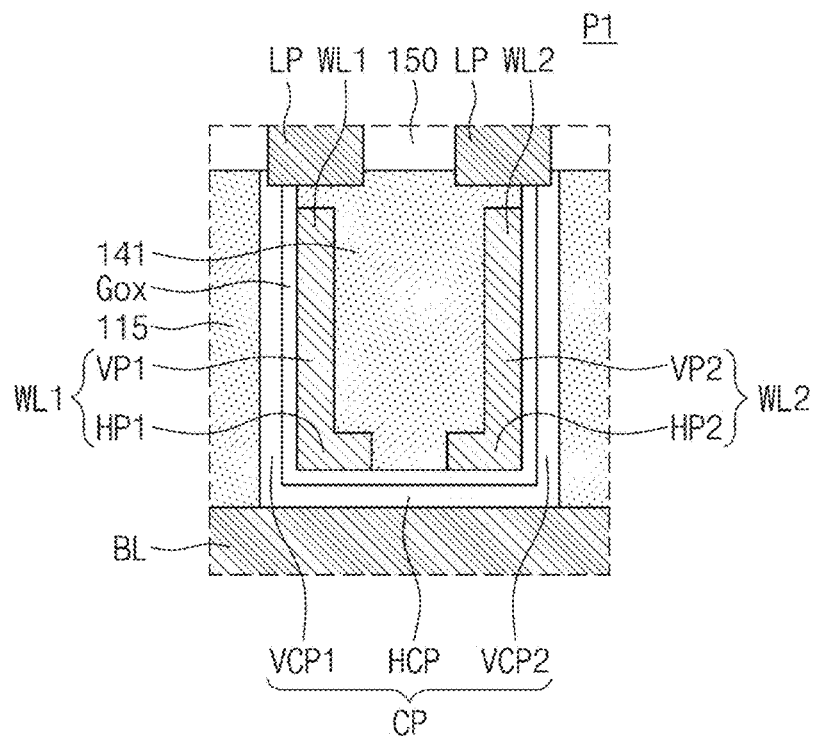

Referring to FIG. 6D, each of first and second word lines WL1 and WL2 may have a substantial L-shape. In other words, each of the first and second word lines WL1 and WL2 may include a first or second horizontal portion HP1 or HP2 located on the horizontal channel portion HCP of the channel pattern CP, and a first or second vertical portion VP1 or VP2 located on the inner sidewall of the first or second vertical channel portion VCP1 or VCP2 of the channel pattern CP. Thus, the first word line WL1 and the second word line WL2 may be mirror-symmetrical to each other. The gate insulating pattern Gox may be disposed in common between the channel pattern CP and the first and second word lines WL1 and WL2. A portion of the gate insulating pattern Gox may be disposed between the first and second word lines WL1 and WL2 when viewed in a plan view. In this case, the portion of the gate insulating pattern Gox may be in contact with the second insulating pattern 141.

Figure 6E:
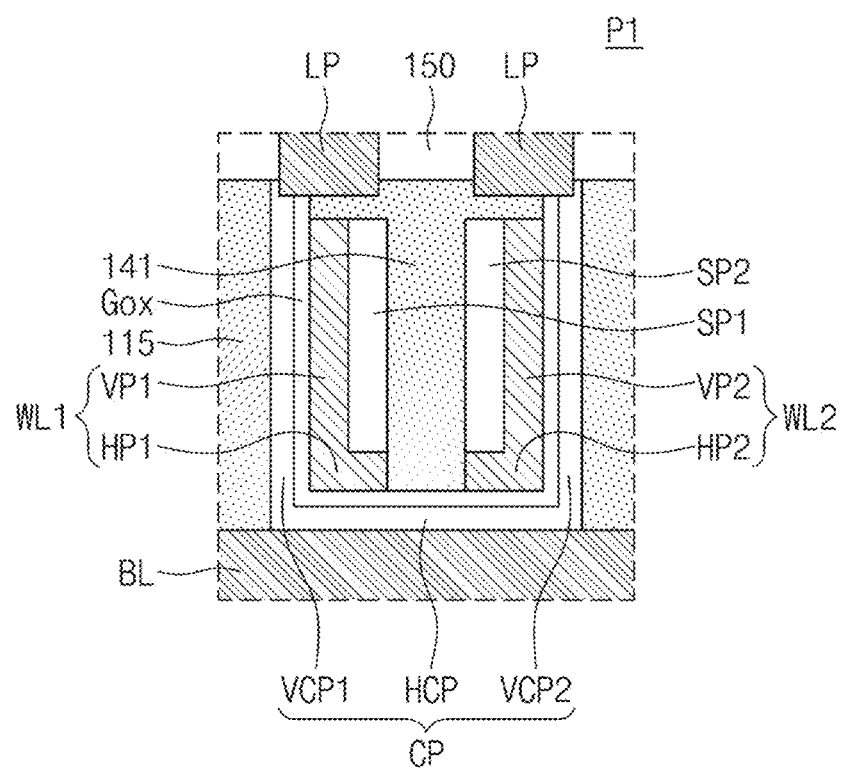

Referring to FIG. 6E, a pair of spacers SP1 and SP2 may further be provided. A first spacer SP1 may be disposed on the first horizontal portion HP1 of the first word line WL1, and a second spacer SP2 may be disposed on the second horizontal portion HP2 of the second word line WL2. The first spacer SP1 may be aligned with or flush with a sidewall of the first horizontal portion HP1 of the first word line WL1, and the second spacer SP2 may be aligned with or flush with a sidewall of the second horizontal portion HP2 of the second word line WL2.

The second insulating pattern 141 may be disposed between the first and second spacers SP1 and SP2. The first and second spacers SP1 and SP2 may prevent or reduce the first and second word lines WL1 and WL2 from being exposed in an etching process.

Figure 7A:
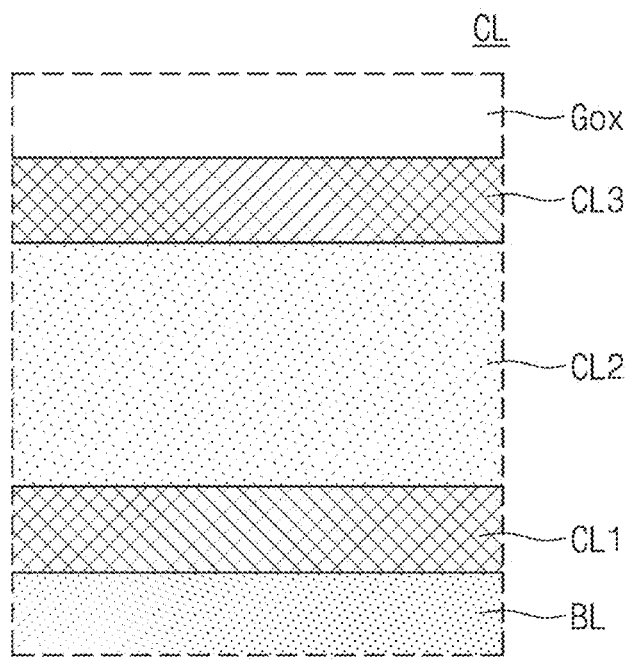
FIG. 7A is an enlarged view of a portion 'CL' of FIG. 6A.
Figure 7B:
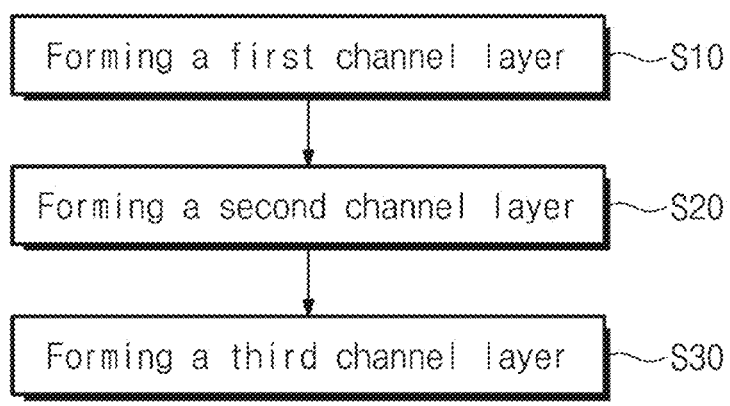
FIG. 7B is a flow chart illustrating a process of forming a channel pattern.
Figure 7C:
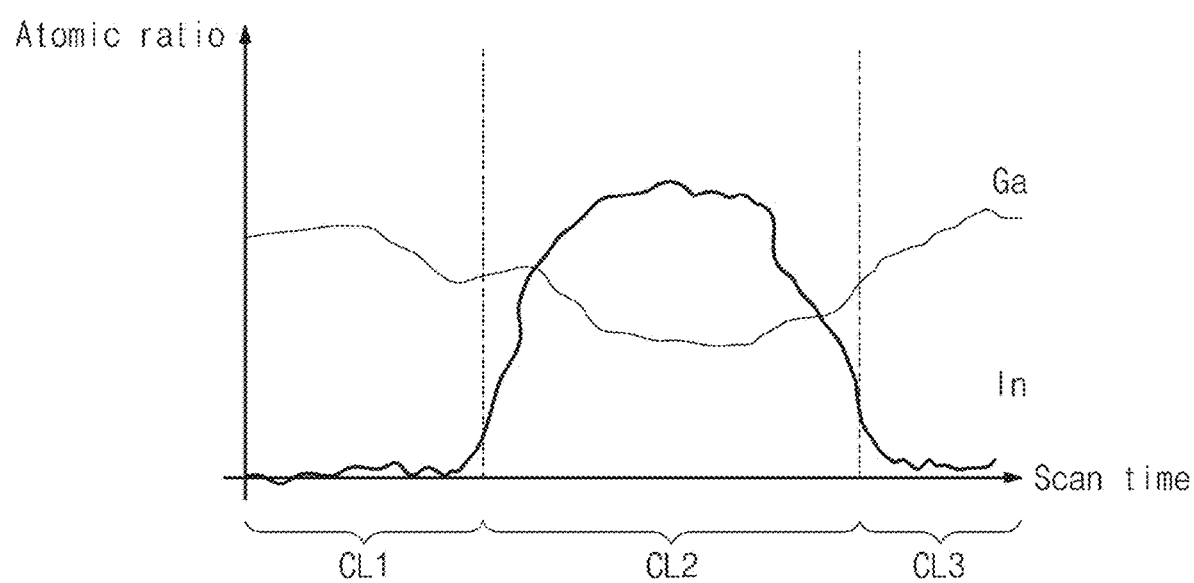
FIG. 7C is a graph showing a composition ratio of atoms according to a line I-I' of FIG. 6A.

FIG. 7A is an enlarged view of a portion 'CL' of FIG. 6A. FIG. 7B is a flow chart illustrating a process of forming a channel pattern. FIG. 7C is a graph showing a composition ratio of atoms according to a line I-I' of FIG. 6A.

Referring to FIG. 7A, the horizontal channel portion HCP of the channel pattern CP may be located on the bit line BL. The gate insulating pattern Gox may be located on the horizontal channel portion HCP of the channel pattern CP. The channel pattern CP may include first, second and third channel layers CL1, CL2 and CL3. The second channel layer CL2 may be located on the first channel layer CL1. The second channel layer CL2 may be disposed between the first and third channel layers CL1 and CL3. A thickness of the first channel layer CL1 in the first direction D1 may be about 1 nm. A thickness of the second channel layer CL2 in the first direction D1 may range from about 5 nm to about 10 nm. A thickness of the third channel layer CL3 in the first direction D1 may be about 1 nm. For example, the first and third channel layers CL1 and CL3 may have substantially the same thickness in the first direction D1, and the thickness of the second channel layer CL2 in the first direction D1 may be greater than the thickness of the first or third channel layer CL1 or CL3 in the first direction D1.

The first to third channel layers CL1, CL2 and CL3 may include a first metal. The second channel layer CL2 may further include a second metal. The first and third channel layers CL1 and CL3 may not include the second material. The first and third channel layers CL1 and CL3 may be formed of substantially the same material. The second channel layer CL2 may include a material different from that of the first or third channel layer CL1 or CL3. The first metal may include gallium (Ga), and the second metal may include indium (In). The first and third channel layers CL1 and CL3 may not include indium.

In some example embodiments, the first and third channel layers CL1 and CL3 may be formed of gallium oxide (GaO), and may not include indium. The second channel layer CL2 may be formed of indium gallium oxide (IGO). The first and third channel layers CL1 and CL3 may have strong bonding strength between gallium and oxygen (O) to prevent or reduce diffusion of oxygen to the outside and/or permeation of external impurities. For example, the first and third channel layers CL1 and CL3 may have improved or excellent layer stability to protect the second channel layer CL2. The first and third channel layers CL1 and CL3 may prevent or reduce the likelihood of or impact of the second channel layer CL2 from being damaged by the material of the bit line BL, the material of the gate insulating pattern Gox, or other materials. Due to the first and third channel layers CL1 and CL3 having the improved or excellent layer stability, a carrier density and/or a mobility of the second channel layer CL2 may not be reduced but may be maintained constant. As a result, deterioration of electrical characteristics of the second channel layer CL2 may be prevented or reduced in likelihood of occurrence and/or of impact from occurrence.

Referring to FIG. 7B, a method of forming the channel pattern CP may include forming a first channel layer (S10), forming a second channel layer (S20), and forming a third channel layer (S30). In other words, the method of forming the channel pattern CP may include sequentially depositing the first to third channel layers CL1, CL2 and CL3.

In some example embodiments, the first to third channel layers CL1, CL2 and CL3 may be deposited by atomic layer deposition (ALD) processes. The first channel layer CL1 may be formed by an ALD process using a gallium precursor and an oxygen reactant. An InO atomic layer formed by an ALD process using an indium precursor and an oxygen reactant and a GaO atomic layer formed by the same method as the first channel layer CL1 may be repeatedly and alternately deposited on the first channel layer CL1 to form the second channel layer CL2. The third channel layer CL3 may be formed on the second channel layer CL2 by substantially the same method as the first channel layer CL1.

In some embodiments, at least one of the first to third channel layers CL1, CL2 and CL3 may be deposited by physical vapor deposition (PVD) processes. More particularly, a multi-cathode (MC) PVD process may be used. A GaO target and an InO target, or the GaO target and an IGO target may be prepared. The first channel layer CL1 may be deposited using the GaO target and not using the InO target or the IGO target. Thereafter, the GaO target may be changed into the IGO target or the InO target may be added to the GaO target, to deposit the second channel layer CL2. Finally, the target may be changed into the GaO target to deposit the third channel layer CL3. For example, the third channel layer CL3 may be formed by substantially the same method as the first channel layer CL1.

In certain example embodiments, at least one of the first to third channel layers CL1, CL2 and CL3 may be deposited by chemical vapor deposition (CVD) processes such as low-pressure CVD (LPCVD) processes and/or plasma enhanced CVD (PECVD) processes. The first channel layer CL1 may be deposited by supplying a gallium precursor into a furnace, without supplying an indium precursor into the furnace. The second channel layer CL2 may be deposited by supplying a gallium precursor and an indium precursor into a furnace at the same time. The third channel layer CL3 may be formed by substantially the same method as the first channel layer CL1.

The first to third channel layers CL1, CL2 and CL3 may be sequentially deposited in a single chamber or furnace without movement. For example, the first to third channel layers CL1, CL2 and CL3 may be formed in-situ.

Referring to FIG. 7C, a composition ratio of atoms of the first to third channel layers CL1, CL2 and CL3 may be measured using a transmission electron microscopy (TEM) energy-dispersive X-ray spectroscopy (EDX). According to some example embodiments, composition ratios of gallium and indium may be measured using the TEM EDX. An indium composition ratio of the first and third channel layers CL1 and CL3 may be substantially zero or may be a value caused by interference noise. An indium composition ratio of the second channel layer CL2 may be higher than a gallium composition ratio of the second channel layer CL2, and in regions adjacent to the first and third channel layers CL1 and CL3, the indium composition ratio of the second channel layer CL2 may be lower than the gallium composition ratio of the second channel layer CL2. A gallium composition ratio of the first and third channel layers CL1 and CL3 may range from about 30 at % to about 60 at %. The indium composition ratio of the second channel layer CL2 may range from about 30 at % to about 90 at %.

Figure 8:
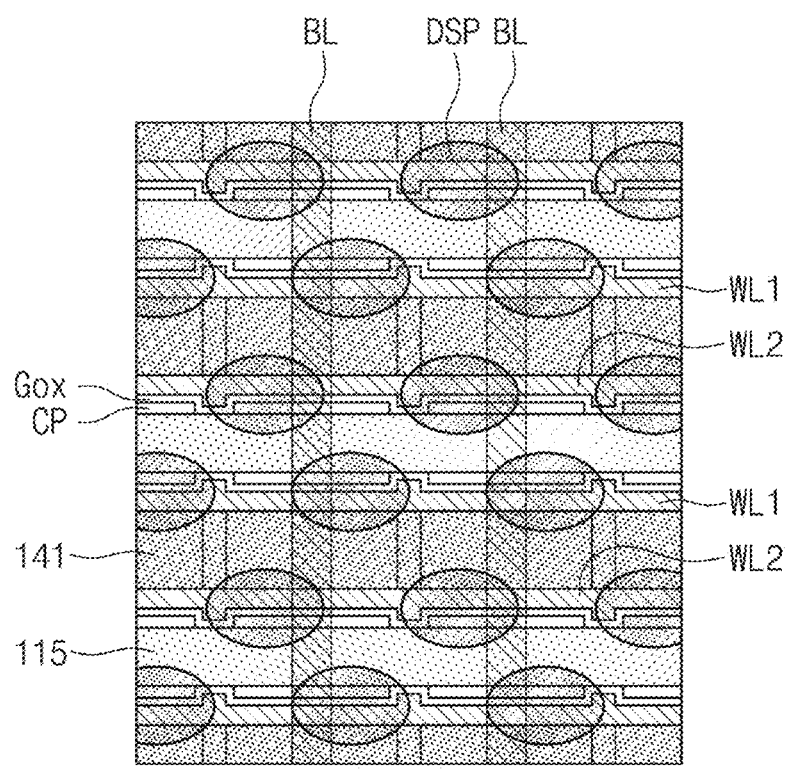
FIG. 8 is a plan view illustrating a semiconductor memory device according to some example embodiments of inventive concepts.

FIG. 8 is a plan view illustrating a semiconductor memory device according to some example embodiments of inventive concepts.

Referring to FIG. 8, in certain example embodiments, the data storage patterns DSP may be arranged in a zigzag form and/or a honeycomb form. The data storage patterns DSP may completely or partially overlap with the landing pads LP (see FIG. 5A). Each of the data storage patterns DSP may be in contact with the whole or a portion of a top surface of each of the landing pads LP (see FIG. 5A).

Figure 9A:
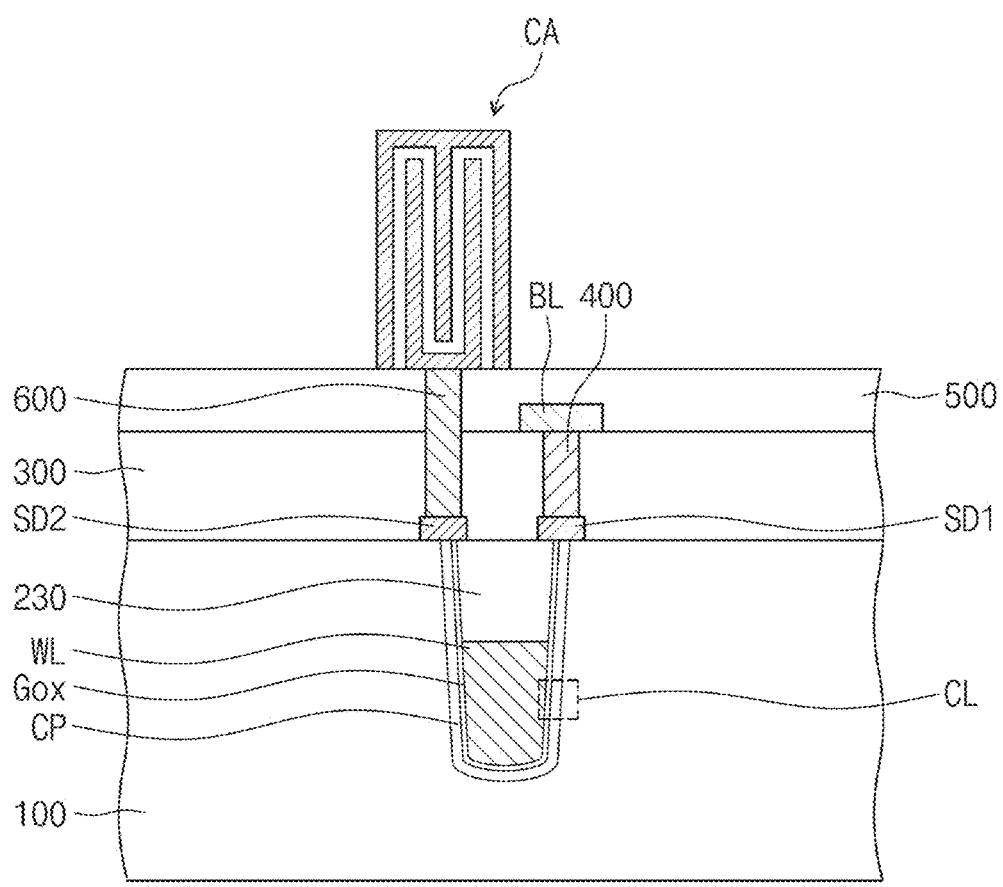
FIG. 9A is a cross-sectional view illustrating a semiconductor memory device according to some example embodiments of inventive concepts.
Figure 9B:
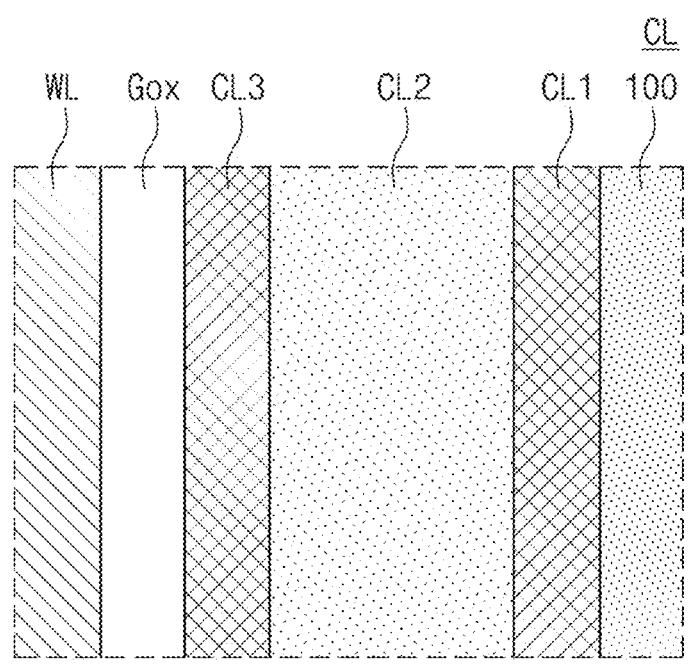
FIG. 9B is an enlarged view of a portion 'CL' of FIG. 9A.

FIG. 9A is a cross-sectional view illustrating a semiconductor memory device according to some example embodiments of inventive concepts. FIG. 9B is an enlarged view of a portion 'CL' of FIG. 9A.

Referring to FIG. 9A, a substrate 100 may include a recess recessed from a portion of its top surface. The recess may be a trench region. A channel pattern CP, a gate insulating pattern Gox, a word line WL and a capping pattern 230 may be disposed in the recess. Widths of upper and lower portions of the recess may be substantially equal to each other, or a width of the recess may become progressively less from its upper portion toward its lower portion. The substrate 100 may include single-crystalline silicon, silicon oxide, silicon nitride, and/or silicon oxynitride.

The channel pattern CP may cover an inner surface of the recess of the substrate 100. Thicknesses of the channel pattern CP in the upper and lower portions of the recess may be substantially equal to each other. The channel pattern CP may be in contact with the substrate 100. A top surface of the channel pattern CP may be located at substantially the same level as the top surface of the substrate 100.

The gate insulating pattern Gox may be located on the channel pattern CP. In other words, the channel pattern CP may be disposed between the gate insulating pattern Gox and the substrate 100. The gate insulating pattern Gox may include an oxide, a nitride, and/or an oxynitride. A top surface of the gate insulating pattern Gox may be located at substantially the same level as the top surface of the channel pattern CP and the top surface of the substrate 100.

The word line WL may be located on the gate insulating pattern Gox. The gate insulating pattern Gox may be disposed between the word line WL and the channel pattern CP. The word line WL may be disposed in the lower portion of the recess of the substrate 100. In other words, the word line WL may be buried in the substrate 100. The word line WL may include a metal such as tungsten (W), copper (Cu), titanium (Ti), or tantalum (Ta).

The capping pattern 230 may be located on the word line WL and the gate insulating pattern Gox. The gate insulating pattern Gox may be disposed between the capping pattern 230 and the channel pattern CP. A top surface of the capping pattern 230 may be located at substantially the same level as the top surface of the substrate 100, the top surface of the gate insulating pattern Gox and the top surface of the channel pattern CP. The capping pattern 230 may include one or more of a silicon oxide layer, a silicon nitride layer, and/or a silicon oxynitride layer.

A first source/drain contact SD1 and a second source/drain contact SD2 may be located on the top surface of the channel pattern CP and the top surface of the gate insulating pattern Gox. The first source/drain contact SD1 and the second source/drain contact SD2 may cover portions of the top surface of the substrate 100 and portions of the top surface of the capping pattern 230. The first source/drain contact SD1 and the second source/drain contact SD2 may be laterally spaced apart from each other. The first source/drain contact SD1 and the second source/drain contact SD2 may include a conductive material such as doped silicon or a metal.

A first interlayer insulating layer 300 may be disposed on the substrate 100, the first source/drain contact SD1, the second source/drain contact SD2, and the capping pattern 230. The first interlayer insulating layer 300 may cover the first source/drain contact SD1 and the second source/drain contact SD2. The first interlayer insulating layer 300 may include one or more of a silicon oxide layer, a silicon nitride layer, and/or a silicon oxynitride layer.

A bit line BL may be disposed on the first interlayer insulating layer 300. The bit line BL may be connected to the first source/drain contact SD1 through a first contact 400 penetrating the first interlayer insulating layer 300. The bit line BL may include a conductive material such as doped silicon and/or a metal. The first contact 400 may electrically connect the first source/drain contact SD1 to the bit line BL.

A second interlayer insulating layer 500 may be disposed on the first interlayer insulating layer 300 and the bit line BL. The second interlayer insulating layer 500 may cover the bit line BL. The second interlayer insulating layer 500 may include one or more of a silicon oxide layer, a silicon nitride layer, and/or a silicon oxynitride layer, independently of the first interlayer insulating layer 300.

A second contact 600 may penetrate the first and second interlayer insulating layers 300 and 500 and may be connected to the second source/drain contact SD2. The second contact 600 may include a conductive material such as doped silicon or a metal. The second contact 600 may electrically connect the second source/drain contact SD2 to a capacitor CA.

A data storage element connected to the second contact 600 may be disposed on the second interlayer insulating layer 500. For example, the data storage element may be the capacitor CA.

Referring to FIG. 9B, the channel pattern CP may be disposed between the gate insulating pattern Gox and the substrate 100, and the channel pattern CP may include first, second and third channel layers CL1, CL2 and CL3. The second channel layer CL2 may be located between the first and third channel layers CL1 and CL3. A thickness of the first channel layer CL1 may be about 1 nm. A thickness of the second channel layer CL2 may range from about 5 nm to about 10 nm. A thickness of the third channel layer CL3 may be about 1 nm. In other words, the thicknesses of the first and third channel layers CL1 and CL3 may be substantially equal to each other, and the thickness of the second channel layer CL2 may be greater than the thickness of the first or third channel layer CL1 or CL3.

Characteristics of the first to third channel layers CL1, CL2 and CL3 and a method of forming the same may be substantially the same as described with reference to FIGS. 7A to 7C.

According to various example embodiments of inventive concepts, the vertical channel transistor may be realized using the channel pattern having a mirror-symmetrical structure. Thus, an integration density of the semiconductor memory device may be improved.

Since the channel pattern having the mirror-symmetrical structure is formed using a deposition method, a technical limitation (e.g., a void or a seam) may not occur, or may be less likely to occur. Thus, electrical characteristics and reliability of the transistor may be improved. Since the channel pattern is formed using the deposition method, a pair of the transistors may be realized at a single channel pattern to reduce a size of a unit memory cell.

Moreover, the channel pattern formed of the multi-layer may be used to prevent or reduce deterioration of the channel pattern, and thus the high carrier density and mobility of the channel pattern may be maintained or more easily maintained. Furthermore, the peripheral circuits may vertically overlap with the cell array, and thus the integration density of the semiconductor memory device may be improved.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various example embodiments of inventive concepts have been particularly shown and described, it will be understood by one of ordinary skill in the art that variations in form and detail may be made therein without departing from the spirit and scope of the attached claims. Furthermore example embodiments are not necessarily mutually exclusive with one another. For example, some example embodiments may include one or more features described with reference to one or more figures, and may also include one or more other figures described with reference to one or more other figures.

What is claimed is:

1. A semiconductor memory device comprising:
   a bit line;
   a channel pattern including a horizontal channel portion on the bit line; and a vertical channel portion vertically protruding from the horizontal channel portion;
   a word line on the horizontal channel portion and on a sidewall of the vertical channel portion; and
   a gate insulating pattern between the word line and the channel pattern,
   wherein the channel pattern includes an oxide semiconductor and comprises first, second, and third channel layers stacked sequentially,
   the first to third channel layers include a first metal,
   the second channel layer further includes a second metal different from the first metal, and
   at least a portion of the first channel layer contacts the bit line.

2. The semiconductor memory device of claim 1, wherein the third channel layer contacts the gate insulating pattern.

3. The semiconductor memory device of claim 1, wherein
   a thickness of the first channel layer is equal to a thickness of the third channel layer, and
   a thickness of the second channel layer is greater than the thickness of the first or third channel layer.

4. The semiconductor memory device of claim 1, wherein
   the first metal includes gallium (Ga), and
   the second metal includes indium (In).

5. The semiconductor memory device of claim 1, wherein a composition ratio of the first metal in each of the first and third channel layers is greater than a composition ratio of the first metal in the second channel layer.

6. The semiconductor memory device of claim 1, wherein
   the word line includes a horizontal portion on the horizontal channel portion of the channel pattern, and a vertical portion on the sidewall of the vertical channel portion of the channel pattern, and
   the horizontal portion is aligned with an inner sidewall of the vertical channel portion.

7. The semiconductor memory device of claim 6, further comprising:
   a spacer on the horizontal portion of the word line,
   wherein the spacer is aligned with a sidewall of the horizontal portion of the word line.

8. The semiconductor memory device of claim 1, wherein
   the horizontal channel portion of the channel pattern has a first thickness on the bit line,
   the vertical channel portion of the channel pattern has a second thickness on an outer sidewall of the word line, and
   the first thickness and the second thickness are equal to each other.

9. The semiconductor memory device of claim 1, wherein a top surface of the word line is at a lower level than a top surface of the vertical channel portion of the channel pattern.

10. The semiconductor memory device of claim 1, further comprising:
    a data storage pattern electrically connected to the vertical channel portion of the channel pattern; and
    a landing pad between the vertical channel portion of the channel pattern and the data storage pattern,
    wherein the first to third channel layers contact the landing pad.

11. A semiconductor memory device comprising:
    a bit line;
    a channel pattern including a horizontal channel portion on the bit line and first and second vertical channel portions vertically protruding from the horizontal channel portion and facing each other;
    first and second word lines on the horizontal channel portion and between the first and second vertical channel portions;
    a gate insulating pattern between the channel pattern and the first and second word lines; and
    an insulating pattern between the first and second word lines,
    wherein the channel pattern includes an oxide semiconductor and comprises first, second, and third channel layers sequentially stacked,
    the first to third channel layers include a first metal,
    the second channel layer further includes a second metal different from the first metal, and
    at least a portion of the first channel layer contacts the bit line.

12. The semiconductor memory device of claim 11, wherein the third channel layer contacts the gate insulating pattern.

13. The semiconductor memory device of claim 11, wherein
    a thickness of the first channel layer is equal to a thickness of the third channel layer, and
    a thickness of the second channel layer is greater than the thickness of the first or third channel layer.

14. The semiconductor memory device of claim 11, wherein
    the first metal includes gallium (Ga),
    the second metal includes indium (In), and
    a composition ratio of the first metal in each of the first and third channel layers is greater than a composition ratio of the first metal in the second channel layer.

15. The semiconductor memory device of claim 11, wherein the first and second word lines include first and second horizontal portions on the horizontal channel portions of the channel pattern, and first and second vertical portions located on sidewalls of the first and second vertical channel portions of the channel pattern, respectively, and
    the first horizontal portion is aligned with an inner sidewall of the first vertical channel portion, and the second horizontal portion is aligned with an inner sidewall of the second vertical channel portion.

16. The semiconductor memory device of claim 15, further comprising:
    a first spacer on the first horizontal portion of the first word line; and
    a second spacer on the second horizontal portion of the second word line,
    wherein the first and second spacers are aligned with the sidewalls of the first and second horizontal portions of the first and second word lines, respectively.

17. The semiconductor memory device of claim 11, wherein
    the gate insulating pattern comprises a first gate insulating pattern between the first word line and the channel pattern, and a second gate insulating pattern between the second word line and the channel pattern, and
    the insulating pattern contacts a portion of the horizontal channel portion of the channel pattern.

18. The semiconductor memory device of claim 11, wherein
    the channel pattern comprises a first channel pattern including a first horizontal channel portion and the first vertical channel portion, and a second channel pattern including a second horizontal channel portion and the second vertical channel portion, and wherein the insulating pattern is in contact with a portion of the bit line.

19. A semiconductor memory device comprising:
a peripheral circuit structure comprising peripheral circuits on a semiconductor substrate, the peripheral circuit structure further comprising a lower insulating layer covering the peripheral circuits;
bit lines extending in a first direction on the peripheral circuit structure;
a first insulating pattern defining a trench extending in a second direction, the trench intersecting the bit lines;
channel patterns spaced apart from each other in the second direction in the trench, wherein each of the channel patterns includes first and second vertical channel portions facing each other, and a horizontal channel portion connecting the first and second vertical channel portions;
first and second word lines extending in the second direction on the horizontal channel portions of the channel patterns, the first word lines adjacent to the first vertical channel portions of the channel patterns, and the second word lines adjacent to the second vertical channel portions of the channel patterns;
a gate insulating pattern between the channel patterns and the first and second word lines and extending in the second direction;
a second insulating pattern covering the first and second word lines in the trench;
first data storage patterns on the first vertical channel portions of the channel patterns; and
second data storage patterns on the second vertical channel portions of the channel patterns,
wherein each of the channel patterns includes an oxide semiconductor and comprises first, second, and third channel layers stacked sequentially,
the first to third channel layers include a first metal,
the second channel layer further includes a second metal different from the first metal, and
at least a portion of the first channel layer contacts the bit line.

20. The semiconductor memory device of claim 19, further comprising:
first landing pads between the first vertical channel portions of the channel patterns and the first data storage patterns; and
second landing pads between the second vertical channel portions of the channel patterns and the second data storage patterns,
wherein the third channel layer contacts the gate insulating pattern,
a thickness of the first channel layer is equal to a thickness of the third channel layer, and a thickness of the second channel layer is greater than the thickness of the first or third channel layer, and
the first to third channel layers contact the first and second landing pads.

* * * * *